US011832408B2

(12) United States Patent
Fredriksson et al.

(10) Patent No.: US 11,832,408 B2
(45) Date of Patent: Nov. 28, 2023

(54) PANEL-SHAPED ELECTRONIC DEVICE WITH INTERSECTING CABLE CHANNELS ON THE BACK SIDE

(71) Applicant: IKEA Supply AG, Pratteln (CH)

(72) Inventors: Andreas Fredriksson, Lund (SE); Stjepan Begic, Malmö (SE)

(73) Assignee: IKEA Supply AG, Prattein (CH)

( * ) Notice: Subject to any disclaimer, the term of this patent is extended or adjusted under 35 U.S.C. 154(b) by 0 days.

(21) Appl. No.: 18/029,861

(22) PCT Filed: Oct. 1, 2021

(86) PCT No.: PCT/SE2021/050966
§ 371 (c)(1),
(2) Date: Mar. 31, 2023

(87) PCT Pub. No.: WO2022/071867
PCT Pub. Date: Apr. 7, 2022

(65) Prior Publication Data
US 2023/0276589 A1    Aug. 31, 2023

(30) Foreign Application Priority Data
Oct. 2, 2020   (SE) .................................... 2051155-6

(51) Int. Cl.
*H05K 5/02* (2006.01)
*H04R 1/02* (2006.01)

(52) U.S. Cl.
CPC ............. *H05K 5/0247* (2013.01); *H04R 1/02* (2013.01); *H04R 2201/021* (2013.01)

(58) Field of Classification Search
None
See application file for complete search history.

(56) References Cited

U.S. PATENT DOCUMENTS

| 4,640,381 A | 2/1987 | Tsuchiya et al. |
| 4,944,694 A | 7/1990 | Dorn |
| 6,312,278 B1 | 11/2001 | Prior |

(Continued)

FOREIGN PATENT DOCUMENTS

| CN | 202632568 U | 12/2012 |
| CN | 107087130 A | 8/2017 |
| KR | 101391121 B1 | 5/2014 |

OTHER PUBLICATIONS

PCT International Search Report for PCT Application No. PCT/SE2021/050966 dated Dec. 11, 2021 (5 pages).

(Continued)

*Primary Examiner* — Xanthia C Cunningham
(74) *Attorney, Agent, or Firm* — Merchant & Gould P.C.

(57) ABSTRACT

A panel-shaped electronic device (100) configured to be mounted to a wall (200), the panel-shaped electronic device (100) comprising: a front side (124) and a back side (126), the back side (126) being configured to face the wall (200) and the front side (124) being opposite to the back side (126), a first cable channel (102) arranged along a vertical edge portion (128) of the back side (126), a second cable channel (108) arranged along a lateral edge portion (130) of the back side (126), and the first and second cable channels (102, 108) intersects at a corner portion (132) of the back side (126).

11 Claims, 3 Drawing Sheets

(56) References Cited

U.S. PATENT DOCUMENTS

| | | | | |
|---|---|---|---|---|
| 6,816,364 B2* | 11/2004 | Helot | ............... | G06F 1/1601 |
| | | | | 248/920 |
| 7,048,418 B2* | 5/2006 | Hur | ............... | G02F 1/133308 |
| | | | | 174/64 |
| 7,345,239 B2 | 3/2008 | Tousignant et al. | | |
| 7,712,946 B2* | 5/2010 | Lee | ............... | G02F 1/13452 |
| | | | | 362/362 |
| 7,898,612 B2* | 3/2011 | Ota | ............... | G02F 1/13476 |
| | | | | 349/150 |
| 8,098,338 B2* | 1/2012 | Tomikawa | ............... | H04N 5/64 |
| | | | | 348/790 |
| 8,373,974 B2* | 2/2013 | Hiratomo | ............... | G06F 1/1601 |
| | | | | 361/679.01 |
| 9,392,715 B2* | 7/2016 | Hwang | ............... | H05K 5/0026 |
| 2007/0039755 A1 | 2/2007 | Mori et al. | | |
| 2013/0321715 A1* | 12/2013 | Millson | ............... | F16M 11/048 |
| | | | | 52/27 |
| 2018/0309957 A1* | 10/2018 | Baldwin | ............... | H04N 7/142 |

OTHER PUBLICATIONS

PCT Written Opinion for PCT Application No. PCT/SE2021/050966 dated Dec. 11, 2021 (4 pages).

"20 Ridiculously Satisfying Examples of Cable Management" theultralinx.com, Retrieved from: https://web.archive.org/web/20200429185019/http://theultralinx.com/2018/09/20-ridiculously-satisfying-examples-of-cable-management/ (Sep. 20, 2018) (25 Pages).

"Hiding Cords" on imgur.com, retrieved from:https://web.archive.org/web/20141108112750/https://imgur.com/a/DlqNw (Nov. 5, 2014); Image 3 and 4 from the top (showing the backside of a TV) (5 pages).

* cited by examiner

PANEL-SHAPED ELECTRONIC DEVICE WITH INTERSECTING CABLE CHANNELS ON THE BACK SIDE

This application is a National Stage Application of PCT/SE2021/050966, filed 1 Oct. 2021, which claims benefit of Serial No. 2051155-6, filed 2 Oct. 2020 in Sweden, and which applications are hereby incorporated by reference in their entireties. To the extent appropriate, a claim of priority is made to each of the above disclosed applications.

FIELD OF THE INVENTION

The present invention relate to electronic devices and to mounting of electronic devices to a wall. More specifically, the present invention relates to a panel-shaped electronic device, to a kit of parts and to a system comprising a first and a second panel-shaped electronic device.

BACKGROUND ART

With active wireless loudspeakers which allows wireless streaming of audio becoming more common, the freedom of how loudspeakers can be formed is increasing. Many prior art sound systems consist of a separate amplifier with one or several thereto connected devices for audio playback such as a television, a streaming device for remote control and/or a CD/DVD-player. The loudspeakers are connected by means of wired connection to the amplifier and thus requires a substantial amount of cables especially when more than two speakers are used. These types of systems are becoming less common as they are space consuming and complicated to install.

Active wireless loudspeakers are self-sustained units which only requires connection to mains power and/or to a battery and can be controlled wirelessly by a remote unit such as a telephone for playback of audio. Such a device provides many benefits in that it has integrated the loudspeakers and amplifier into one device, thus reducing the complexity of installation and increasing the freedom of how the device can be placed in a room.

However, with the increase in applications that is brought about with active loudspeakers, new problems arise. For instance, facilitation of interconnection of active loudspeakers is desired. To reduce the complexity of installation of active loudspeakers is further a common aim for developers of such devices.

SUMMARY OF THE INVENTION

In view of that stated above, the object of the present invention is to provide a panel-shaped electronic device which facilitates installation thereof. Another object is to provide a system of panel-shaped electronic devices which facilitates installation and connection of the panel-shaped electronic devices to each other.

To achieve at least one of the above objects and also other objects that will be evident from the following description, there is provided a panel-shaped electronic device configured to be mounted to a wall. The panel-shaped electronic device comprises:
a front side and a back side, the back side being configured to face the wall and the front side being opposite to the back side,
a first cable channel arranged along a vertical edge portion of the back side,
a second cable channel arranged along a lateral edge portion of the back side,
the first and second cable channels intersects at a corner portion of the back side.

The first cable channel comprises a plurality of cable outlets arranged along the first cable channel for extraction of a cable housed in the first cable channel and the second cable channel comprises a plurality of cable outlets arranged along the second cable channel for extraction of a cable housed in the second cable channel. The panel-shaped electronic device can thus be mounted to the wall in a flexible way in terms of the arrangement of cables in the respective cable channel.

A respective one of the first cable channel and the second cable channel may comprise a respective first cable outlet at a respective first end portion thereof, a respective second cable outlet at a respective second end portion thereof and a respective third cable outlet at a respective middle portion thereof.

The first cable channel and/or the second cable channel may be formed by respective grooves in the back side.

The panel-shaped electronic device may further comprise a cable cove configured to receive wound up excess cables, the first and second cable channels intersecting the cable cove. A cable can thus be adjusted for instance by pushing the cable into a cable outlet whereby excess cable is stored/wound up in the cable cove and oppositely if the cable is pulled out of a cable outlet. The cable cove further allows storing wound up excess cable that is not needed for connecting the panel-shaped electronic device to a mains power outlet or to another panel-shaped electronic device.

The cable cove may coincide with the first cable channel and/or the second cable channel.

The cable cove may comprise an input cable connection and an output cable connection, allowing connection of an input cable and an output cable in the cable cove.

The input cable connection and the output cable connection may be electric power connections, such that power received in the input cable connection via a first cable connected at the input cable connection is relayed to a second cable connected to the output cable connection. Two or more panel-shaped electronic devices can thus be connected to each other with only one having to be connected to a mains power outlet.

The front side and the back side may be integrally formed.
Further still, the first cable channel may comprise:
a longitudinal cable outlet formed in the longitudinal direction of the first cable channel, and
an orthogonal cable outlet formed orthogonally in relation to the longitudinal direction of the first cable channel, and/or the second cable channel may comprise:
a longitudinal cable outlet formed in the longitudinal direction of the second cable channel, and
an orthogonal cable outlet formed orthogonally in relation to the longitudinal direction of the second cable channel. The respective orthogonal cable outlets facilitating connecting two panel-shaped electronic arranged side by side by means of horizontally arranged cables. The longitudinal cable outlets facilitate connecting two panel-shaped electronic devices arranged vertically one above the other using vertically extending cables.

In a second aspect is a kit of parts provided, the kit of parts comprising:
a cable having a cross-section, and
a panel-shaped electronic device according to the first aspect, wherein the first cable channel and the second cable channel having a width being between 5% and 15% wider than the cross-section of the cable. The cable will thus be held sufficiently by friction in the respective cable channel to remain without falling out. However, the friction is sufficiently low to allow it to be overcome when manually pushing or pulling a cable into/out of a cable outlet which allows adjustment of the cable(s) when the cable(s) is arranged in the respective cable channel and e.g. when the panel-shaped electronic device is arranged on the wall.

In a third aspect is a system provided comprising:

a first panel-shaped electronic device according to the first aspect, a second panel-shaped electronic device according to the first aspect, a first cable connecting the first panel-shaped electronic device to a power source such as a main power outlet, a second cable interconnecting the first and second panel-shaped electronic devices such that the second panel-shaped electronic device is connected to the power source, a portion of the first cable is inserted into the first and/or the second cable channel of the first panel-shaped electronic device, wherein a first portion of the second cable is inserted into the first and/or the second cable channel of the first panel-shaped electronic device, a second portion of the second cable is inserted into the first and or the second cable channel of the second panel-shaped electronic device. A system of panel-shaped electronic devices is thus provided for which installation is facilitated in that the first and second cables can easily be arranged in a desired way.

Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, where the same reference numerals will be used for similar elements, wherein.

DESCRIPTION OF EMBODIMENTS

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
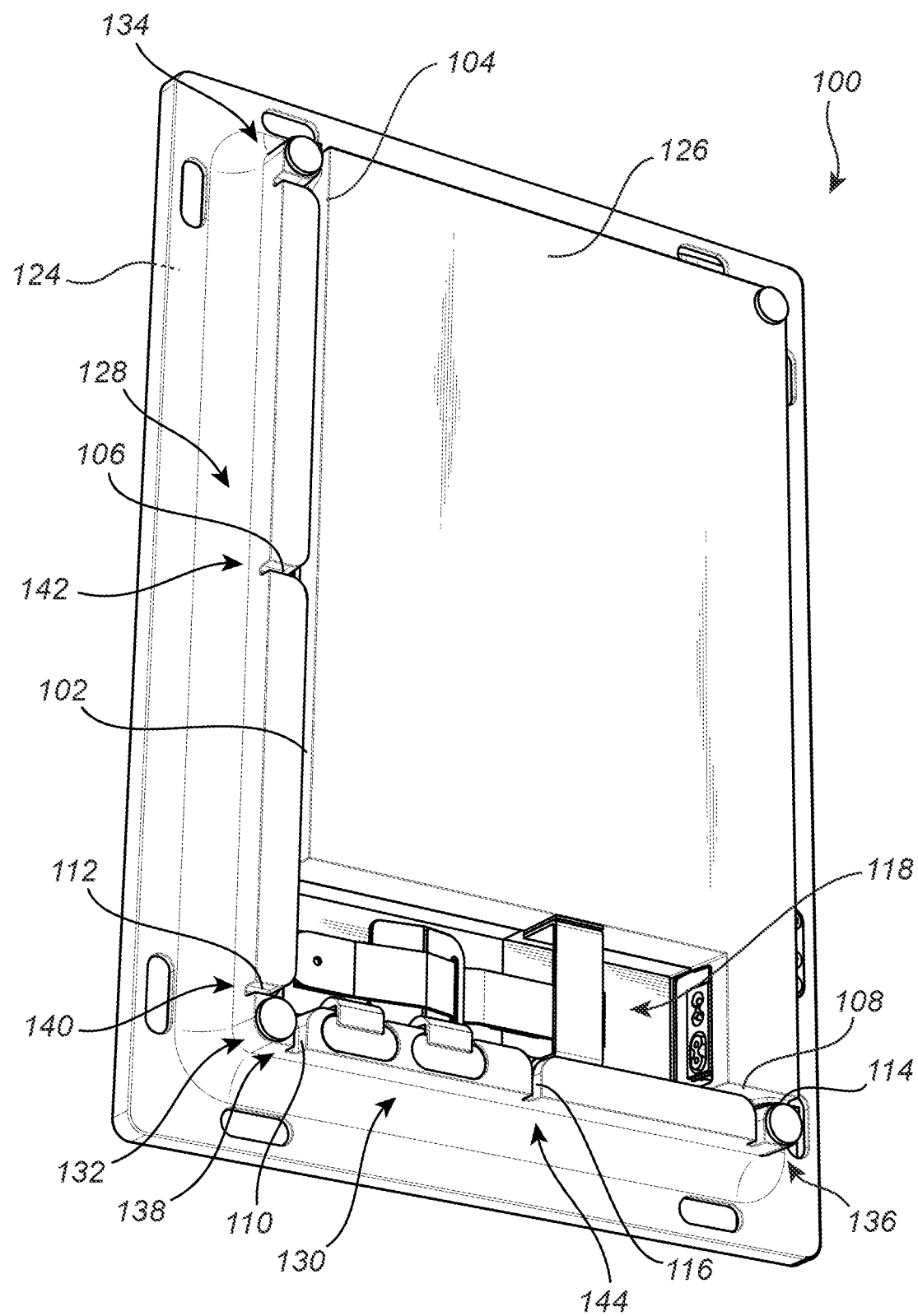
FIG. 1 discloses a rear view of a panel-shaped electronic device.

FIG. 1 shows a rear view of a panel-shaped electronic device 100 according to one embodiment. The panel-shaped electronic device 100 is configured to be attached to/suspended from a wall 200 (shown in FIG. 3) by means of a suitable fastener such as a bracket or one or several screws. The panel-shaped electronic device 100 may be a loudspeaker and/or a lamp or a combination thereof. Other implementations of panel shaped electronic devices may include air purifiers, fans or monitors/TV-panels.

For wall-mounted electronic devices, such as the panel-shaped electronic device 100, it is generally desired that associated cables are easy to arrange in an organized manner. This is however often a time consuming task to achieve and may involve dissassembly of the electronic device and/or adjustments of the lengths of the cables (for instance by cutting the cables) in order to achieve a desired arrangement. This is especially true for electronic devices connected in series, where one cable is arranged interconnecting two adjacent electronic devices.

The panel-shaped electronic device 100 provided herein facilitates the aforementioned process. The panel-shaped electronic device 100 comprises a front side 124 and a back side 126. The back side 126 is configured to face the wall 200, preferably be flush therewith, and the front side 124 is opposite to the back side 126. The front side 124 thus faces towards the room and may for instance function as a speaker grille and/or a lamp shade. The front and back side 124, 126 of the panel-shaped electronic device 100 are preferably integrally formed with each other. The integrated embodiment facilitates easy installation, while the cable channels 102, 108 as discussed below still allows for easy to arrange cables therein and are thus particularly beneficial for a panel-shaped electronic device 100 having an integrated front and back side 124, 126.

The panel-shaped electronic device 100 may be made from a plastic material such as Acrylonitrile butadiene styrene (ABS) or Polycarbonates (PC) and be formed for instance by means of injection moulding.

The panel-shaped electronic device further comprises a first cable channel 102 arranged along a vertical edge portion 128 of the back side 126. The vertical edge portion 128 is to be construed as not necessarily at the very edge of the back side 126 but in the vicinity thereof, as is illustrated in FIG. 1. It is also to be realized that a first cable channel 102 may be arranged at either or both vertical edge portions of the back side 126.

A second cable channel 108 is further arranged along a lateral edge portion 130 of the back side 126. The lateral edge portion 130 is to be construed as a not necessarily at the very edge of the back side 126 but in the vicinity thereof, as is illustrated in FIG. 1. A second cable channel 108 may further be arranged at the opposite lateral edge portion of the back side 126 as well or instead.

The first and second cable channels 102, 108 are preferably formed by respective grooves in the back side 126 of the panel-shaped electronic device 100. I.e. the respective cable channels 102, 108 are preferably open channels such that a cable 146a, 146b, 146c easily can be arranged therein.

Preferably, the depth of the first and second cable channels 102, 108 respectively is such that at least one cable 146a, 146b, 146c (shown in FIG. 3) can be arranged in each of the channels 102, 108 without protruding outside of the back side 126.

However, the depth of the first and second cable channels 102, 108 may in one embodiment be such that at least two cables 146a, 146b, 146c can be arranged on top of each other in each channel 102, 108.

The first and second cable channels 102, 108 intersect at a corner portion 132 of the back side 126, thus allowing a cable 146a, 146b, 146c to be arranged with extension from the first cable channel 102 to the second cable channel 108 and vice versa.

Figure 3:
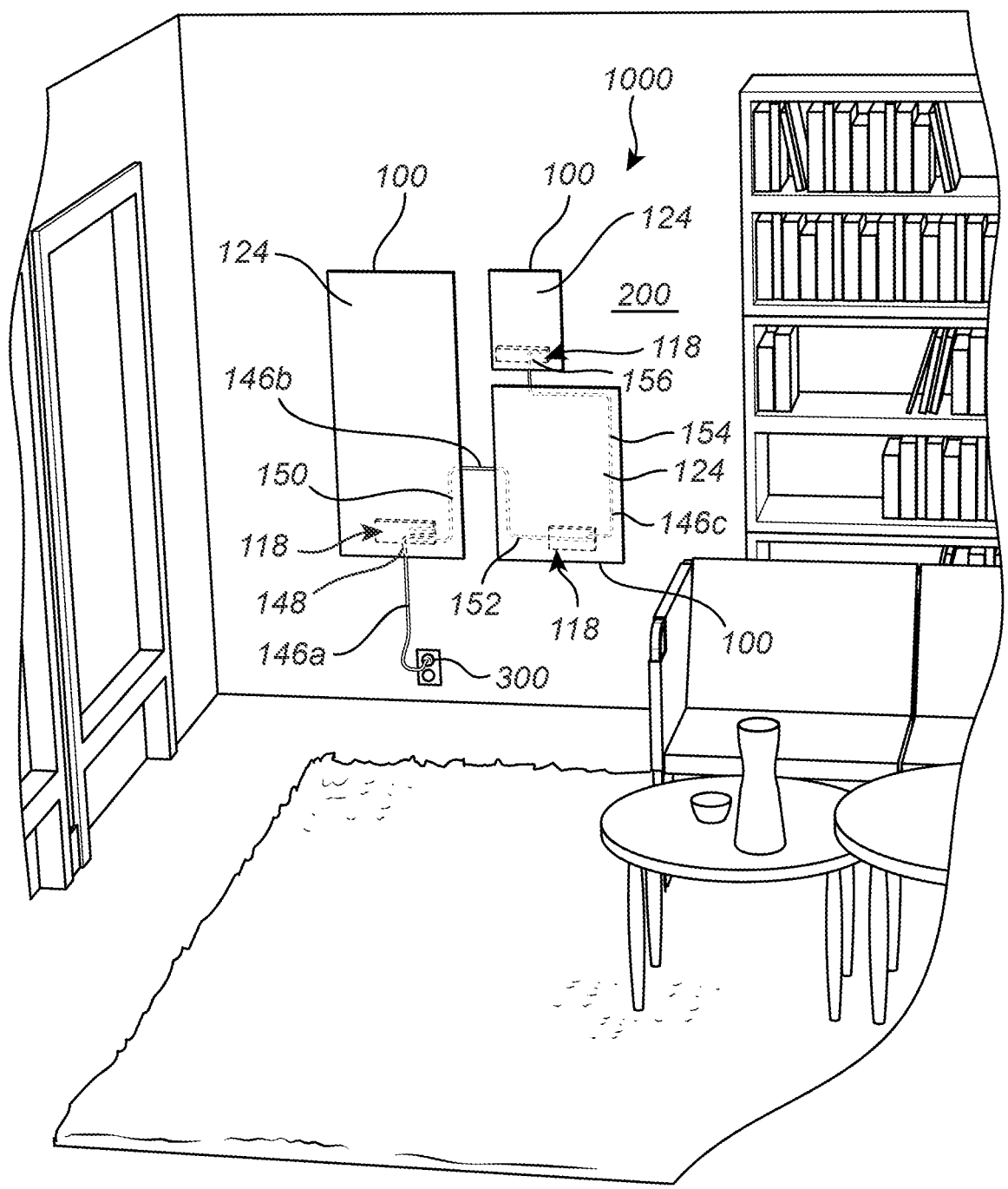
FIG. 3 discloses a perspective view of a system comprising a first and a second panel-shaped electronic device.

The first cable channel 102 comprises a plurality of cable outlets 104, 106, 110, 112 arranged along the first cable channel 102 for extraction of a cable 146a, 146b, 146c housed in the first cable channel 102. A cable outlet should in the context of the present disclosure be understood as an opening through which one or several cables can exit/enter the panel-shaped device 100 and the cable channels therein. The cable(s) may be arranged to connect the panel-shaped electronic device 100 to a mains power outlet 300 (as shown in FIG. 3) and/or to another panel-shaped electronic device 100 (as shown in FIG. 3).

As is mentioned above, the first cable channel 102 may be deep enough to house several cables 146a, 146b, 146c whereby a cable can be extracted through two or more of the cable outlets 104, 106, 110, 112 of the first cable channel 102. Moreover, more than one cable 146a, 146b, 146c can be extracted through/out from each cable outlet 104, 106, 110, 112.

The second cable channel 108 also comprises a plurality of cable outlets 110, 112, 114, 116 arranged along the second cable channel 108 for extraction of a cable 146a, 146b, 146c housed in the second cable channel 108. As for the first channel 102, the second cable channel 108 may be deep enough to house several cables 146a, 146b, 146c whereby one cable can be extracted through two or more of the cable outlets 110, 112, 114, 116 of the first cable channel 102. Moreover, more than one cable 146a, 146b, 146c can be extracted through/out from each cable outlet 110, 112, 114, 116.

The cable(s) arranged in the first and second channel 102, 108 respectively may be an input power cable from a mains power outlet 300. The cable(s) may further be an output power cable that is intended to relay electric power from a mains power supply to another panel-shaped electronic device 100 (as will be described further below).

As is shown in the embodiment disclosed in FIG. 1, the first cable channel 102 comprises a first cable outlet 104 at a first end portion 134 thereof, a second cable outlet 110, 112 at a second end portion 138 thereof, and a third cable outlet 106 at a middle portion 142 thereof. A cable 146a, 146b, 146c can thus be extracted or inserted into the first cable channel 102 at a desired location which provides large flexibility in connecting several panel-shaped electronic device 100 to each other and/or to mains power, thus facilitating positioning of the panel-shaped electronic device 100.

The second cable channel 108 further similarly comprises a first cable outlet 114 at a first end portion 136 thereof, a second cable outlet 110, 112 at a second end portion 140 thereof, and a third cable outlet 116 at a middle portion 144 thereof. A cable outlet, such as cable outlets 110, 112 in FIG. 1, can form a part of both the first and the second cable channel 102, 108 as the cable channels 102, 108 intersect and may thus share cable outlets.

As is also realized, the first and second cable channels 102, 108 may be provided with fewer or more cable outlets than those shown in FIG. 1.

A cable cove 118 may further be provided. The cable cove 118 is configured to receive wound up excess cables 146a, 146b, 146c. The first and second cable channels 102, 108 are arranged such that they intersect the cable cove 118, whereby cables 146c, 146b, 146c arranged in both the first and the second cable channel 102, 108 can be wound up in the cable cove 118. The cable cove 118 is formed by an opening in the back side 126 of the panel-shaped electronic device 100.

With the first and second cable channels 102, 108 intersecting the cable cove 118, the cables 146a, 146b, 146c can be adjusted when the panel-shaped electronic device 100 is mounted to a wall by pushing/pulling the respective cable that is to be adjusted into/out of the appropriate cable outlet. The cable 146a, 146b, 146c will then move accordingly in the corresponding cable channel 102, 108 and excess cable will be wound up or extracted from the cable cove 118 such that the cable 146a, 146b, 146c can be adjusted. A cable 146a, 146b, 146c can thus be adjusted to be sufficiently taut for instance between two panel-shaped electronic devices 100 or between a panel-shaped electronic device 100 and a mains power outlet 300.

What can further be seen in FIG. 1 is that a longitudinal cable outlet 104, 110 is formed in the longitudinal direction of the first cable channel 102. Preferably, both end portions 134, 138 of the first cable channel 102 end in longitudinal cable outlets 104, 110. The longitudinal direction of the first cable channel 102 is to be considered the direction defined by the extension of the first cable channel 102, which also applies correspondingly to the longitudinal direction of the second cable channel 108.

The first cable channel 102 may further be provided with an orthogonal cable outlet 106 formed orthogonally in relation to the longitudinal direction of the first cable channel 102. The orthogonal cable outlet 106 may be arranged in the middle portion 142 of the first cable channel 102, thus allowing a cable 146a, 146b, 146c to be connected to the panel-shaped electronic device 100 laterally from the side i.e. to a vertical edge portion 128 thereof. As is realized, more than one orthogonal cable outlet 106 may be provided, for instance one orthogonal cable outlet may be provided at each of the end portions 132, 134 of the first cable channel 102 as well. In other embodiments, two or more orthogonal cable outlets are uniformly spread out along the first cable channel 102 between the two end portions 132, 134. Vertical corners formed where each orthogonal cable outlet 106 intersects the first cable channel 102 may be rounded for facilitating insertion and extraction of the cable 146a, 146b, 146c into the first cable channel 102.

The second cable channel 108 may further comprise a longitudinal cable outlet 112, 114 formed in the longitudinal direction of the second cable channel 108 and an orthogonal cable outlet 116 formed orthogonally in relation to the longitudinal direction of the second cable channel 108. As with the first cable channel 102, the second cable channel 108 may be provided with a longitudinal cable outlet 112, 114 in each of the end portions 136, 140 thereof. Moreover, more than one orthogonal cable outlet 116 may be provided to the second cable channel 108 in a similar fashion as described above for the first cable channel 102. Vertical corners formed where each orthogonal cable outlet 116 intersects the second cable channel 108 may be rounded for facilitating insertion and extraction of the cable 146a, 146b, 146c into the second cable channel 108.

Figure 2:
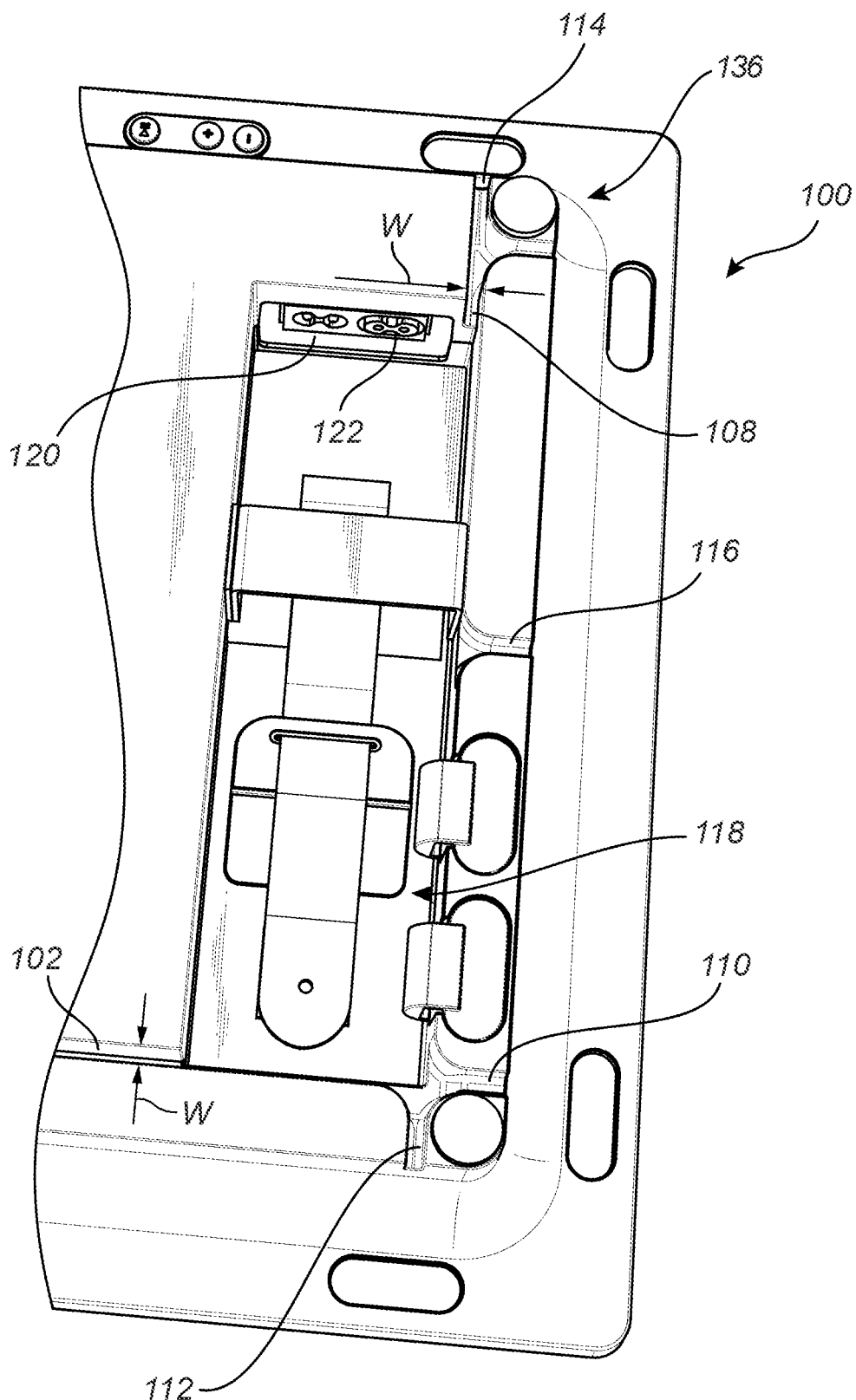
FIG. 2 discloses detail view of a cable cove of a panel-shaped electronic device.

In FIG. 2, the cable cove 118 is shown in a detail view. The cable cove 118 may as is shown in FIG. 2 coincide with the first cable channel 102 and/or the second cable channel 108.

The cable cove 118 may also as is shown in FIG. 2 comprise an input cable connection 120 and an output cable connection 122. The input cable connection 120 and the output cable connection 122 are preferably electric power connections, such that electric power received via a first cable 146a connected at the input cable connection 120 can be relayed to a second cable 146b, 146c connected to the output cable connection 122. The panel-shaped electronic device 100 can thus be arranged such that only one of a plurality of panel-shaped electronic devices 100 have to be connected to the mains power outlet 300. Moreover, by arranging the connections 120, 122 in the cable cove 118, the connectors on the cables 146a, 146b, 146 will not obstruct the positioning of the panel-shaped electronic device 100 on the wall 200.

The first cable channel 102 and the second cable channel 108 are preferably provided with a width W which is between 5% and 15% wider than a cross-section of the cable 146a, 146b, 146c that is to be arranged in the respective cable channel 102, 108. The width W is defined as the width orthogonally to the longitudinal direction of the respective cable channel 102, 108. A width in the range above provides sufficient friction due to the slightly winding tendency of cables to hold the respective cable 146a, 146b, 146c in the respective cable channel 102, 108. However, the friction is sufficiently low to be overcome manually to allow adjustment of the respective cable 146a, 146b, 146c by pulling/pushing the cable out of/into a cable outlet 104, 106, 110, 112, 116, 114.

Turning lastly to FIG. 3 which shows a system 1000 comprising three panel-shaped electronic devices 100. The system 1000 could however comprise two panel-shaped electronic devices 100, or more than three panel-shaped electronic device 100. Each of the panel-shaped electronic devices 100 is mounted to the wall 200 by means of a suitable fastener. The back side 126 of each panel-shaped electronic device 100 is thus facing the wall and is preferably flush with the wall 200. Each front side 124 of each panel-shaped electronic device 100 is accordingly facing away from the wall 200.

A first cable 146a is provided connecting the first panel-shaped electronic device 100 to a power source 300. A portion 148 of the first cable 146a is shown inserted into the second cable channel 108 of the first panel-shaped electronic device 100. The portion 148 of the first cable 146a could however be inserted into the first cable channel 102 as well. Excess cable could be wound up in the cable cove 118 and the first cable 146a is preferably connected to the input cable connection 120 of the first panel-shaped electronic device 100.

A second cable 146b is provided interconnecting two of the panel-shaped electronic devices 100 such that both panel-shaped electronic devices 100 are connected to the power source 300. A first portion 150 of the second cable 146b is inserted into the first cable channel 102 of the first panel-shaped electronic device 100. The first portion 150 is connected to the output cable connection 122 of the first panel-shaped electronic device 100. A second portion 152 of the second cable 146b is inserted into the first cable channel 108 of the second panel-shaped electronic device 100 and is connected to the input cable connection 120 thereof. The electric power is thus relayed from the main power outlet 300 via the first panel-shaped electronic device 100 to the second panel-shaped electronic device 100. The first cable 146a can be vertically arranged from the power outlet 300 to a cable outlet of the first panel-shaped electronic device 100 while the second cable 146b can be horizontally arranged between the first and second panel-shaped electronic devices.

The provision of a plurality of cable outlets 104, 106, 110, 112 of the first cable channel 102 and a plurality of cable outlets 110, 112, 114, 116 of the second cable channel 108 of each panel-shaped electronic device 100, the first and second cables 146a, 146b can be arranged vertically or horizontally with a high degree of flexibility of relative positioning of the panel-shaped electronic devices 100.

The third panel-shaped electronic device 100 is connected to the second panel-shaped electronic device 100 by means of a third cable 146c having a first portion 154 arranged in the first cable channel 102 of the second panel-shaped electronic device 100. The first portion 100 of the third cable 14c could thus be connected the outlet power connection 122 of the second panel-shaped electronic device 100. A second portion 156 of the third cable 146c is arranged in the second cable channel 108 of the third panel-shaped electronic device 100 and connected to the input power connection 100 thereof.

Each interconnecting cable 146a, 146b, 146c can thus in an easy and flexible way be arranged either vertically or horizontally which provides a pleasing aesthetic appearance. The panel-shaped electronic devices 100 can be placed with a large degree of freedom in terms of relative placement to each other and still achieve horizontal or vertical arrangements of the cables 146a, 146b, 146c. The cables 146a, 146b, 146c can further be adjusted when the panel-shaped electronic devices 100 are installed such that each cable is sufficiently taut.

It will be appreciated that the present invention is not limited to the embodiments shown. Several modifications and variations are thus conceivable within the scope of the invention which thus is exclusively defined by the appended claims.

The invention claimed is:

1. A panel-shaped electronic device configured to be mounted to a wall, the panel-shaped electronic device comprising:
   a front side and a back side, the back side being configured to face the wall and the front side being opposite to the back side,
   a first cable channel arranged along a vertical edge portion of the back side,
   a second cable channel arranged along a lateral edge portion of the back side,
   the first and second cable channels intersects at a corner portion of the back side,
   wherein the first cable channel comprises a plurality of cable outlets arranged along the first cable channel for extraction of a cable housed in the first cable channel and wherein the second cable channel comprises a plurality of cable outlets arranged along the second cable channel for extraction of a cable housed in the second cable channel.

2. The panel-shaped electronic device according to claim 1, wherein a respective one of the first cable channel and the second cable channel comprises a respective first cable outlet at a respective first end portion thereof, a respective second cable outlet at a respective second end portion thereof, and a respective third cable outlet at a respective middle portion thereof.

3. The panel-shaped electronic device according to claim 1, wherein the first cable channel and/or the second cable channel is formed by respective grooves in the back side.

4. The panel-shaped electronic device according to claim 1, further comprising a cable cove configured to receive wound up excess cables, wherein the first and second cable channels intersects the cable cove.

5. The panel-shaped electronic device according to claim 4, wherein the cable cove coincides with the first cable channel and/or the second cable channel.

6. The panel-shaped electronic device according to claim 4, wherein the cable cove comprises an input cable connection and an output cable connection.

7. The panel-shaped electronic device according to claim 6, wherein the input cable connection and the output cable connection are electric power connections, such that power received in the input cable connection via a first cable connected at the input cable connection is relayed to a second cable connected connected to the output cable connection.

8. The panel-shaped electronic device according to claim 1, wherein the front side and the back side are integrally formed.

9. The panel-shaped electronic device according to claim 1, wherein the first cable channel comprises:
a longitudinal cable outlet formed in the longitudinal direction of the first cable channel, and
an orthogonal cable outlet formed orthogonally in relation to the longitudinal direction of the first cable channel, and/or wherein the second cable channel comprises:
a longitudinal cable outlet formed in the longitudinal direction of the second cable channel, and
an orthogonal cable outlet formed orthogonally in relation to the longitudinal direction of the second cable channel.

10. A kit of parts comprising:
a cable having a cross-section, and
a panel-shaped electronic device according to claim 1, wherein the first cable channel and the second cable channel having a width being between 5% and 15% wider than the cross-section of the cable.

11. A system comprising:
a first panel-shaped electronic device according to claim 1, a second panel-shaped electronic device according to claim 1 to a first cable connecting the first panel-shaped electronic device to a power source,
a second cable interconnecting the first and second panel-shaped electronic devices such that the second panel-shaped electronic device is connected to the power source,
wherein a portion of the first cable is inserted into the first and/or the second cable channel of the first panel-shaped electronic device,
wherein a first portion of the second cable is inserted into the first and/or the second cable channel of the first panel-shaped electronic device,
wherein a second portion of the second cable is inserted into the first and or the second cable channel of the second panel-shaped electronic device.

* * * * *